US010354737B2

(12) United States Patent
Hu

(10) Patent No.: US 10,354,737 B2
(45) Date of Patent: Jul. 16, 2019

(54) NON-VOLATILE MEMORY SUB-BLOCK ERASURE DISTURB MANAGEMENT SCHEME

(71) Applicant: WESTERN DIGITAL TECHNOLOGIES, INC., San Jose, CA (US)

(72) Inventor: Xinde Hu, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 15/630,389

(22) Filed: Jun. 22, 2017

(65) Prior Publication Data
US 2018/0374551 A1 Dec. 27, 2018

(51) Int. Cl.
G11C 16/34 (2006.01)
G06F 12/02 (2006.01)
(Continued)

(52) U.S. Cl.
CPC ...... *G11C 16/3431* (2013.01); *G06F 12/0253* (2013.01); *G11C 11/5628* (2013.01);
(Continued)

(58) Field of Classification Search
CPC .............. G11C 16/3431; G11C 16/349; G11C 16/0483; G11C 16/10; G11C 16/16;
(Continued)

(56) References Cited

U.S. PATENT DOCUMENTS 7,286,401 B2 * 10/2007 Ishimaru ............ G11C 16/0425
365/185.08
8,300,463 B2 * 10/2012 Park ...................... G11C 16/10
365/185.09
(Continued)

OTHER PUBLICATIONS

German Office Action dated Nov. 26, 2018, DE Patent Application No. 102018105529.3 filed May 3, 2018.
(Continued)

*Primary Examiner* — Vu A Le
*Assistant Examiner* — Sung Il Cho
(74) *Attorney, Agent, or Firm* — Vierra Magen Marcus LLP

(57) ABSTRACT

A non-volatile memory is configured to allow programming and erase at the sub-block level. In a sub-block erase, some of the memory cells can be selected for erase while others are not selected for erase, such as by leaving their word lines to float while applying the erase voltage to the well structure of the physical block to which the sub-blocks belong. Although a sub-block erase applies a lower electric field across the non-selected memory cells than the erase selected memory cells, it still places the non-selected memory cells under some degree of stress and can lead to erase disturb. To help manage this erase disturb, each sub-block has an associated erase disturb count, which is incremented when another sub-block of the same physical block is erased, but reset when the sub-block itself is erase. Once a count reaches a threshold value, the sub-block can be marked for remedial action, such as refresh or garbage collection.

18 Claims, 18 Drawing Sheets

(51) Int. Cl.
*G11C 11/56* (2006.01)
*G11C 16/04* (2006.01)
*G11C 16/10* (2006.01)
*G11C 16/16* (2006.01)

(52) U.S. Cl.
CPC ...... *G11C 11/5635* (2013.01); *G11C 16/0483* (2013.01); *G11C 16/10* (2013.01); *G11C 16/16* (2013.01); *G11C 16/349* (2013.01); *G11C 16/3445* (2013.01); *G11C 16/3459* (2013.01)

(58) Field of Classification Search
CPC ............ G11C 16/3445; G11C 16/3459; G11C 11/5635; G11C 11/5628; G06F 12/0253
USPC ..................................................... 365/185.29
See application file for complete search history.

(56) References Cited

U.S. PATENT DOCUMENTS

| | | | | |
|---|---|---|---|---|
| 9,240,235 | B2* | 1/2016 | Alrod | G11C 13/0033 |
| 9,563,504 | B2 | 2/2017 | Liang et al. | |
| 9,583,201 | B1* | 2/2017 | Lee | G11C 16/16 |
| 2005/0041515 | A1* | 2/2005 | Futatsuyama | G11C 16/16 |
| | | | | 365/232 |
| 2011/0199825 | A1* | 8/2011 | Han | G11C 16/10 |
| | | | | 365/185.11 |
| 2012/0170365 | A1* | 7/2012 | Kang | G11C 16/0483 |
| | | | | 365/185.03 |
| 2013/0007353 | A1* | 1/2013 | Shim | G11C 16/10 |
| | | | | 711/103 |
| 2014/0108705 | A1 | 4/2014 | Gorobets | |
| 2014/0136765 | A1* | 5/2014 | Oh | G11C 16/0483 |
| | | | | 711/103 |
| 2015/0186055 | A1* | 7/2015 | Darragh | G06F 3/0616 |
| | | | | 711/103 |
| 2016/0011815 | A1* | 1/2016 | Klein | G06F 3/0644 |
| | | | | 714/6.12 |
| 2016/0180939 | A1 | 6/2016 | Louie et al. | |
| 2016/0329084 | A1* | 11/2016 | Han | G11C 29/1201 |
| 2017/0025182 | A1 | 1/2017 | Sabde et al. | |
| 2017/0123972 | A1* | 5/2017 | Gopinath | G06F 12/0253 |
| 2018/0144802 | A1* | 5/2018 | Choi | G06F 12/0246 |

OTHER PUBLICATIONS

Response to Office Action dated Mar. 14, 2019, DE Patent Application No. 102018105529.3 filed May 3, 2018.

* cited by examiner

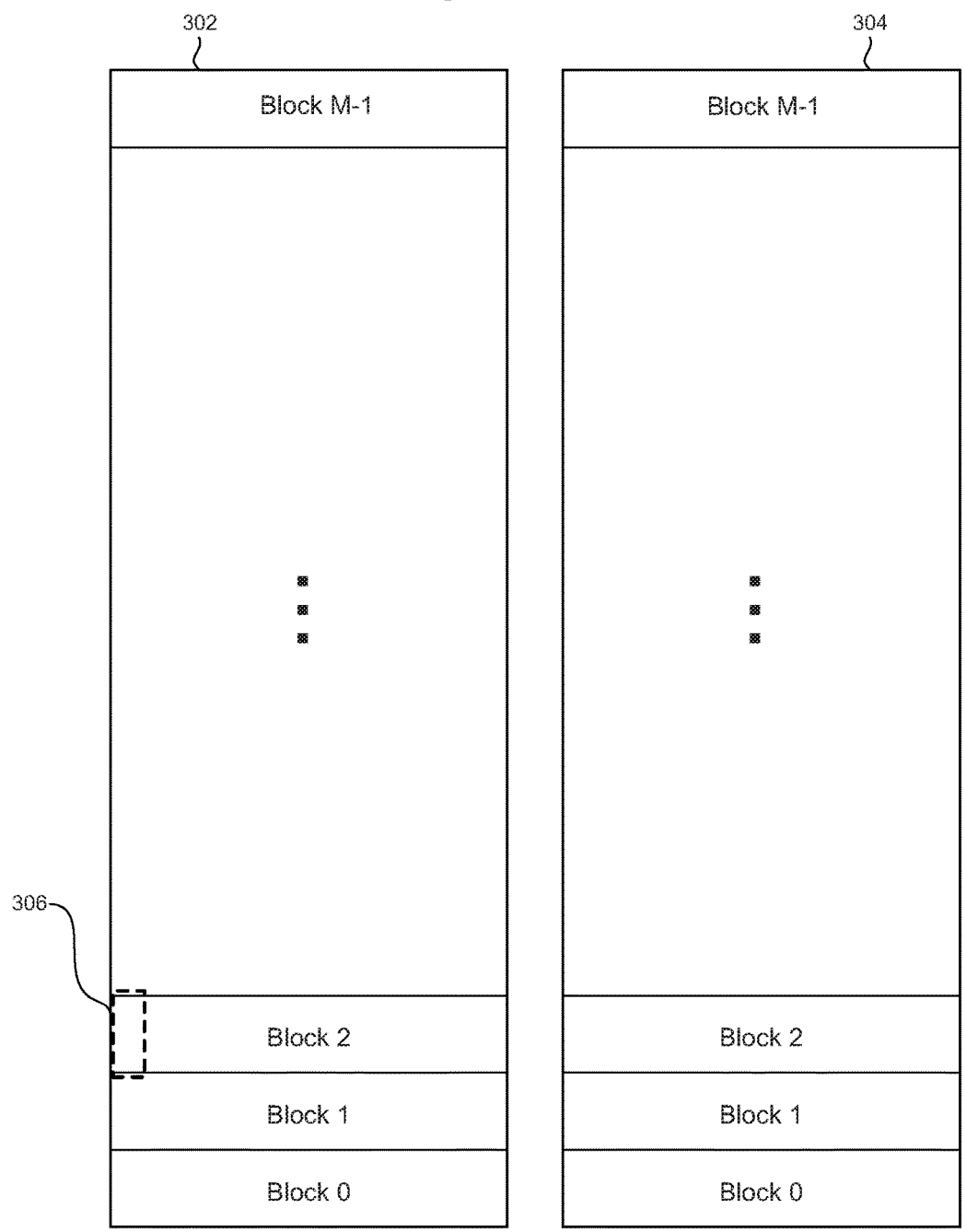

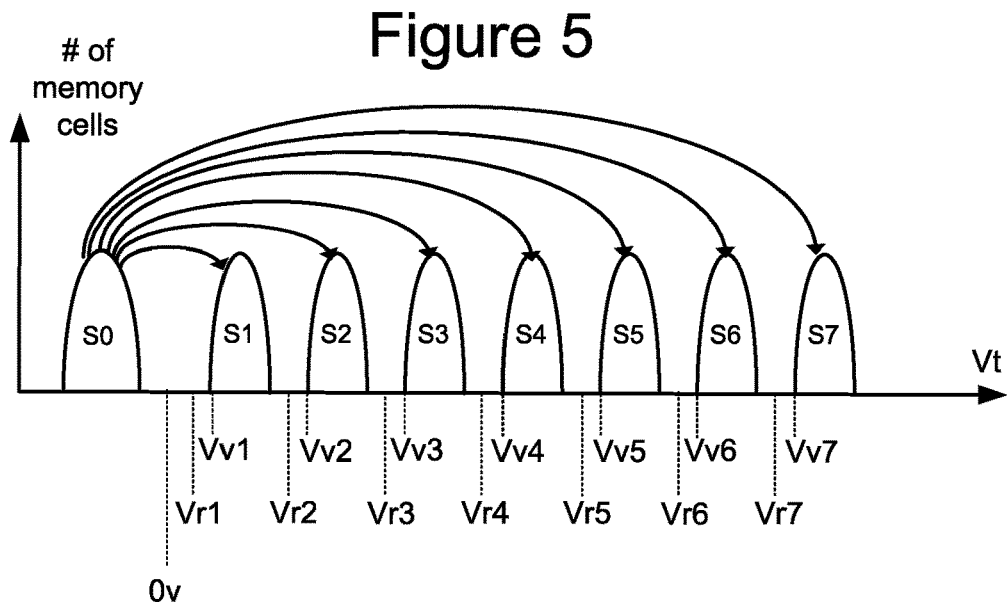
Figure 5
Figure 6
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
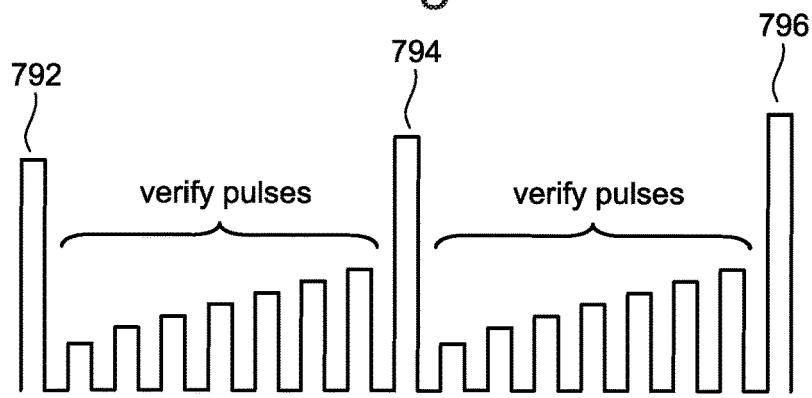
Figure 7C

NON-VOLATILE MEMORY SUB-BLOCK ERASURE DISTURB MANAGEMENT SCHEME

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

As memory structures increase in density, it becomes more challenging to maintain the integrity of the data being stored.

BRIEF DESCRIPTION OF THE DRAWINGS

Like-numbered elements refer to common components in the different figures.

FIG. 4A is a block diagram of a memory structure having two planes.

FIG. 5 depicts threshold voltage distributions.

FIG. 6 is a table describing one example of an assignment of data values to data states.

FIG. 7C depicts a word line voltage during programming and verify operations.

DETAILED DESCRIPTION

Figure 1:
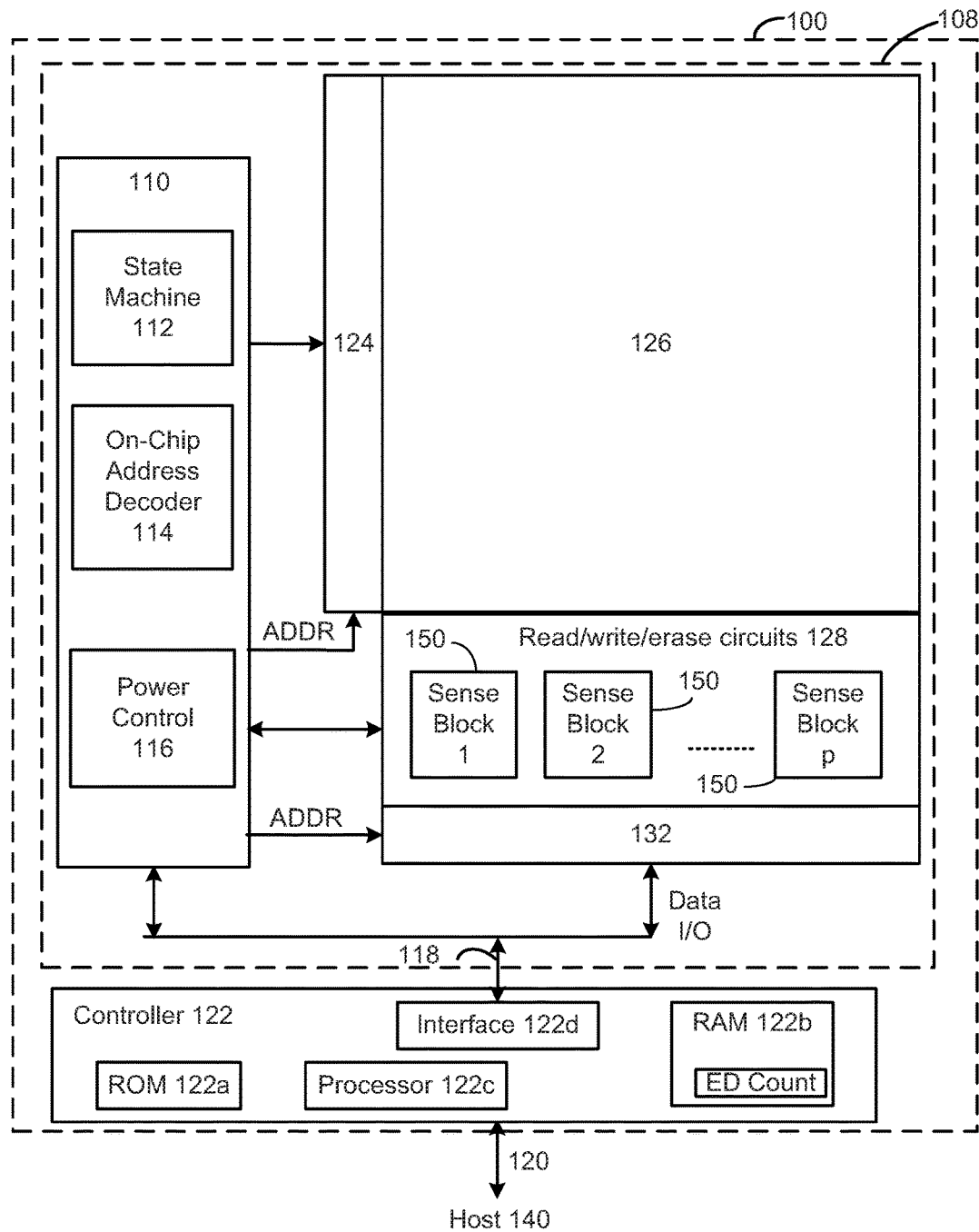
FIG. 1 is a functional block diagram of a memory device.

Data stored in non-volatile memory can degrade over time. This can be due to a number causes, such as charge leakage in memory cells whose data state is based on a stored charge level. Data degradation on one memory cell can result from memory operations performed on other memory cells. For example, reading or writing of data in one memory cell places stress on nearby memory cells that can lead to a read or write "disturbs" on these nearby memory cells that can alter their data states. Erase operations can also lead to an erase disturb on nearby memory cells not being erased.

For example, in a two-dimensional array of charge storing non-volatile memory cells, an erase operation for a block of memory cells typically involves setting the control gates of the block's memory cells to low voltage or ground and applying a high erase voltage to the well structure under the array, thereby removing charge stored in the block's memory cells. In a three dimensional (3D) NAND array (such as the BiCS structure) of charge storing non-volatile memory cells, the memory cells of the block again have their control gates set to a low voltage or ground, and the erase voltage is applied to the source lines of the NAND strings for the block from the well structure under the block.

Some memory structures allow for a partial block erase. To take a particular example discussed below, a 3D NAND memory is configured such that memory cells of either a top half sub-block or a bottom half sub-block can be erased, while the other sub-block is not selected for erase. This can be done by allowing the word lines of the non-selected sub-block to float, while the word lines of the selected sub-block are held to an erase enable voltage of ground or other low voltage level. When the erase voltage is then applied to the channel of the NAND strings, the potential difference across the charge storing region in the selected sub-block reduces the amount of stored charge. As the word lines of the non-selected sub-block are left to float, the word line levels are pulled up so these cells are not erased, or at least not to the same degree as for the selected cells. Even though the non-selected cells are not subjected to the same stress as the erase selected cells, the voltage levels involved can lead to a non-negligible amount of erase disturb. As the amount of disturb accumulates over the course of repeated erase operations, this can eventually lead to the data no longer being readable.

Although memory systems commonly use Error Correction Codes (ECC) that can correct a degree of error, to prevent data corruption due to erase or other disturb mechanisms, remedial action can be taken on the stored data. The remedial actions include refresh and garbage collection operations. In a refresh operation, data is read and corrected as needed, and then freshly written, either back into the same location or, more commonly, another location in the memory. In a garbage collection operation, data is read out and corrected, obsolete data is discarded, and current data is consolidated and re-written. Depending on the state of the data, in some case it may be necessary to use shifted, or margined, read conditions and use other measures to successfully extract the data as part of the remedial action.

The following presents schemes for the management of erase disturb in non-volatile memory systems that allow sub-block level erase. For sets of memory cells of the block that can be erased at the sub-block level, a count is maintained of the number of erases performed on other sets of memory cells in the block. This count is incremented with each erase involving other memory cells in the block, but reset when the sub-block itself is erased. If the count of a sub-block reaches a threshold value, the sub-block is marked for remedial action.

FIGS. 1-4F describe one set of examples of a memory system that can be used to implement the technology proposed herein. FIG. 1 is a functional block diagram of an example memory device. The components depicted in FIG. 1 are electrical circuits. Memory device 100 includes one or more memory die 108. Each memory die 108 includes a three dimensional memory structure 126 of memory cells (such as, for example, a 3D array of memory cells), control circuitry 110, and read/write/erase circuits 128. In other embodiments, a two dimensional array of memory cells can be used. Memory structure 126 is addressable by-word lines via a row decoder 124 and by bit lines via a column decoder 132. The read/write/erase circuits 128 include multiple sense blocks 150 including Sense Block 1, Sense Block 2, . . . , Sense Block p (sensing circuitry) and allow a page of memory cells (connected to the same word line) to be read or programmed in parallel. In some systems, a controller 122 is included in the same memory device 100 as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write/erase circuits 128 to perform memory operations (e.g., erase, program, read, and others) on memory structure 126, and includes a state machine 112, an on-chip address decoder 114, and a power control module 116. The state machine 112 provides die-level control of memory operations, such as programming different memory cells to different final targets for a common data state based on distance to an edge of a word line layer. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write/erase circuits 128, and/or controller 122 can be considered a control circuit that performs the functions described herein.

The (on-chip or off-chip) controller 122 (which in one embodiment is an electrical circuit) may comprise one or more processors 122c, ROM 122a, RAM 122b, and Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described below related to programming different memory cells to different final targets for a common data state based on distance to an edge of a word line layer. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. The controller can maintain various operating parameters in RAM 122b, such as the erase disturb counts (ED Count) this are discussed in more detail below. As discussed further below, For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
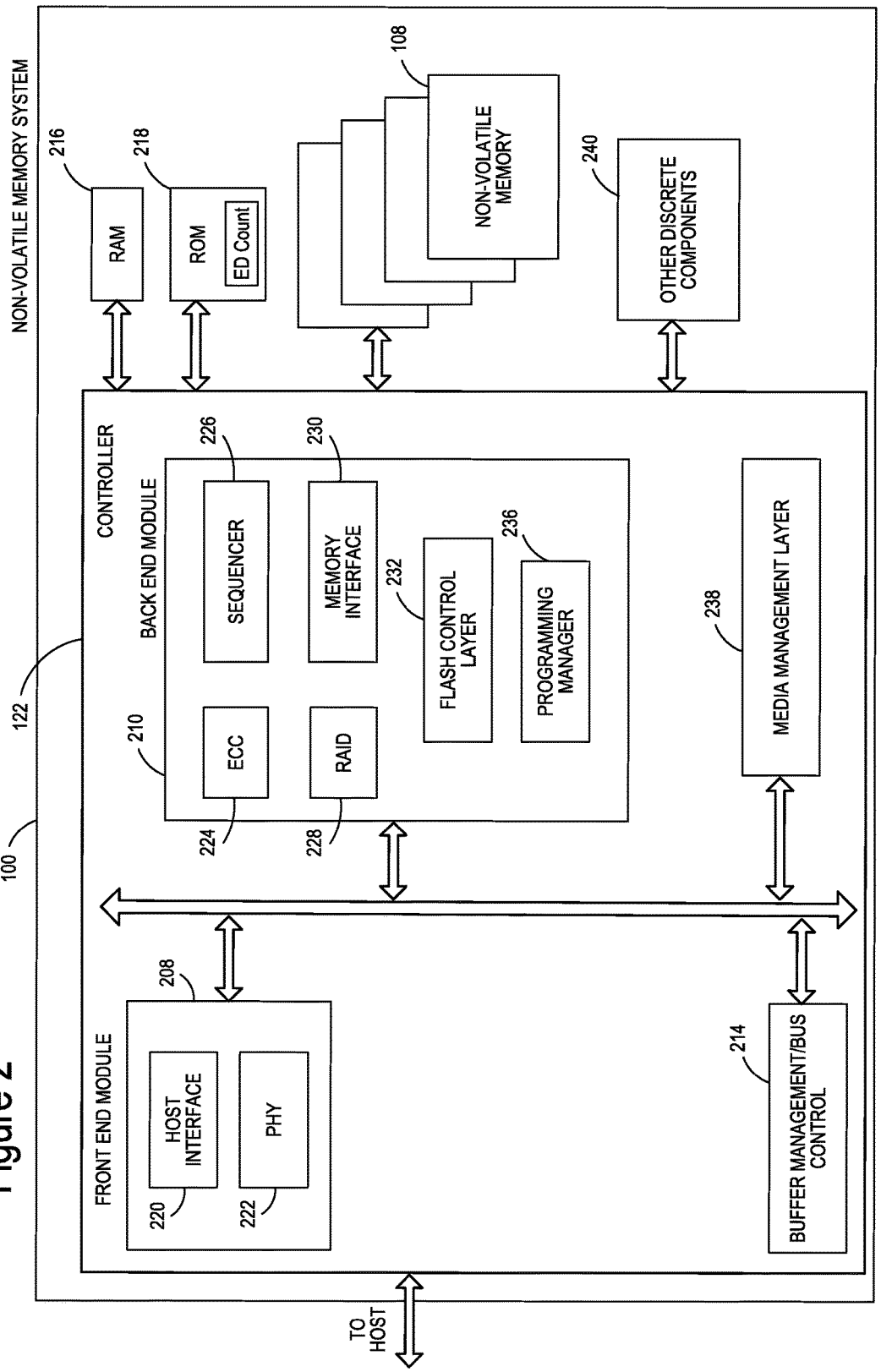
FIG. 2 is a block diagram depicting one embodiment of a memory system.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 112 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. Among the other information stored in RAM 216, the erase disturb counts (ED Count) that are discussed in more detail below are again explicitly represented. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a programming manager 236, which can be used to manage (in conjunction with the circuits on the memory die) the programming of memory cells closer to an edge of the word line layer and memory cells further from the edge of the word line layer to a first data state representing first data such that the memory cells closer to the edge of the word line layer are programmed to a first final threshold voltage distribution using a first final verify level and the memory cells further from the edge of the word line layer are programmed to a second final threshold voltage distribution using a second verify level, where the second verify level is lower than the first verify level and the second final threshold voltage distribution is lower in voltage than the first threshold voltage distribution. For example, in one embodiment, programming manager 236 may perform and/or manage the processes of FIGS. 7A, 12, 14 and 15, described below. More details of programming manager 236 are also provided below with respect to those figures. Programming manager 236 can be an electrical circuit, a set of one or more software modules, or a combination of a circuit and software.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
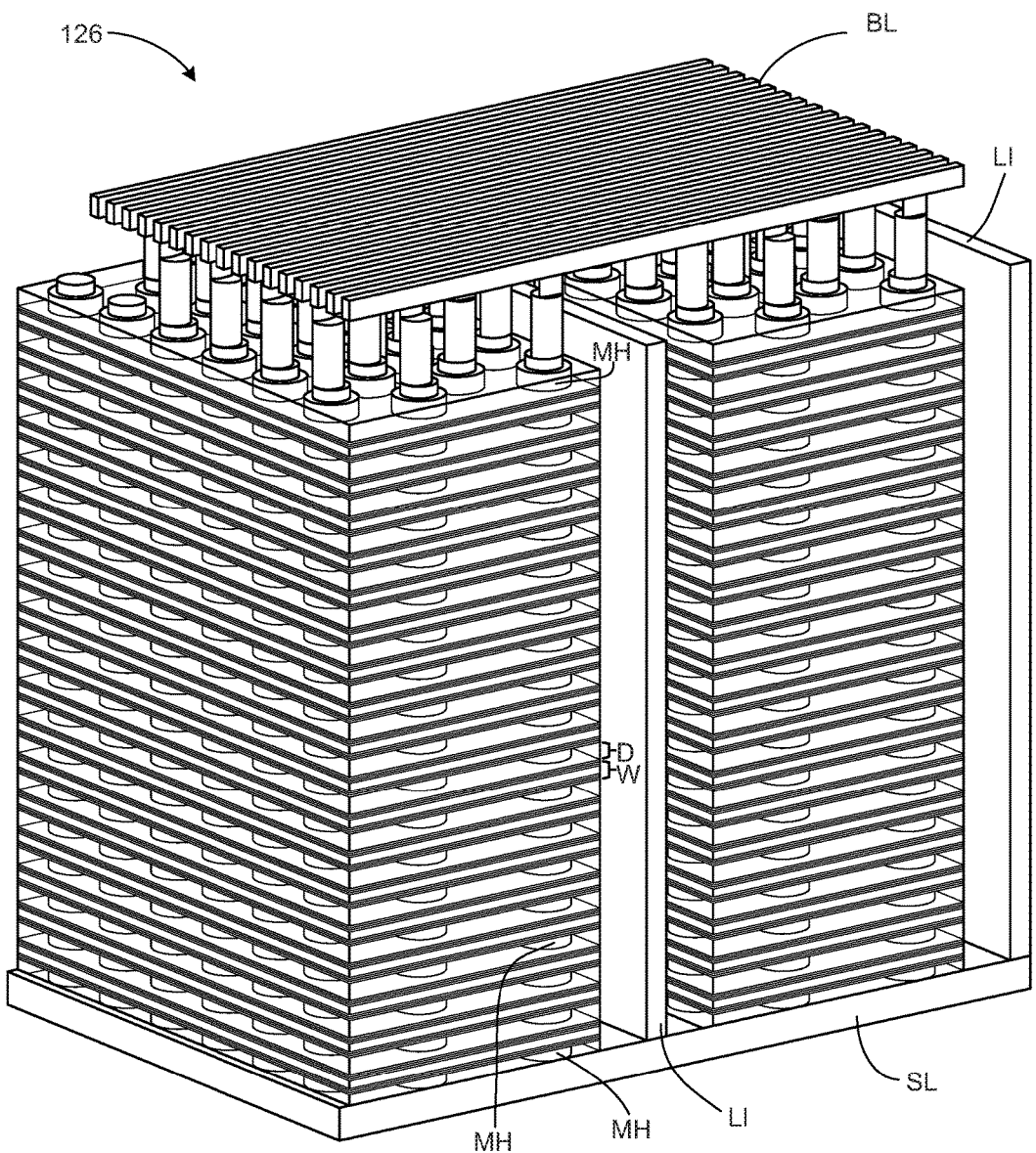
FIG. 3 is a perspective view of a portion of one embodiment of a monolithic three dimensional memory structure.

FIG. 3 is a perspective view of a portion of one example embodiment of a monolithic three dimensional memory structure 126, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3 only shows two fingers and two local interconnects LI. Below the alternating dielectric layers and word line layers is a source line layer SL. Memory holes are formed in the stack of alternating dielectric layers and conductive layers. For example, one of the memory holes is marked as MK Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
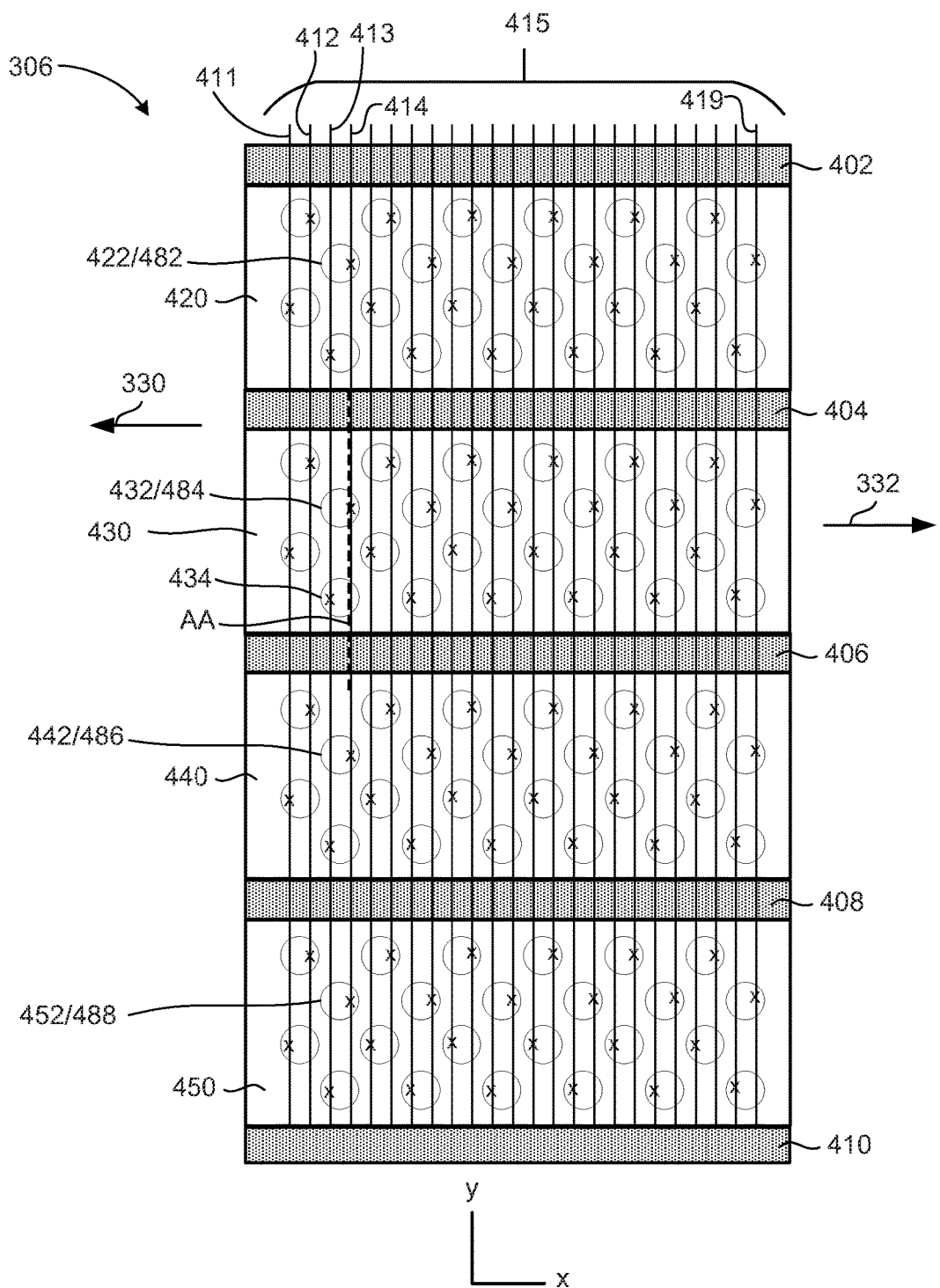
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string and, therefore, can be referred to as a memory column. A memory column can implement other types of memory in addition to NAND. FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation areas 402, 404, 406, 408 and 410 that serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the isolation areas (also serving as local interconnects). In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Isolation areas 402, 404, 406, 408 and 410 also connect the various layers to a source line below the vertical columns. In one embodiment, isolation areas 402, 404, 406, 408 and 410 are filled with a layer of $SiO_2$ (blocking) and a layer of poly-silicon (source line connection).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
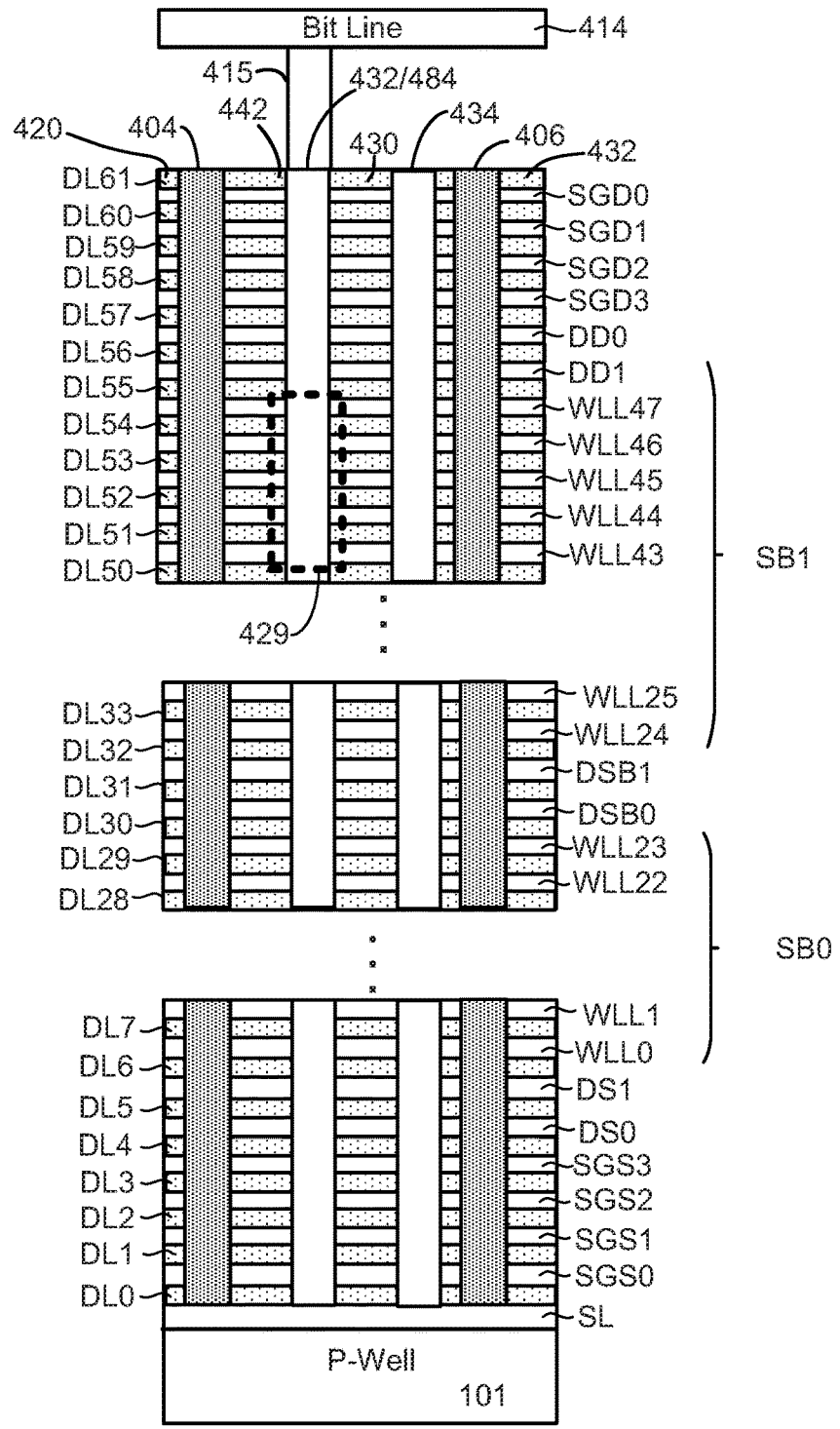
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. The NAND string of vertical column 432 has a source end at a bottom of the stack and a drain end at a top of the stack. As in agreement with FIG. 4B, FIG. 4C show vertical column 432 connected to Bit Line 414 via connector 415. Isolation areas 404 and 406 are also depicted. Below the vertical columns and the layers listed below, and over the underlying substrate, is source line SL and well region P-Well 101. A block of memory cells will share a common well region and in an erase operation, the erase voltage Verase is applied to the P-Well 101 and, through the source line SL, to channel region of the vertical columns.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL61. For example, dielectric layers DL51 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

To increase the density of data storage, block size can be increased by including more layers of word lines, increasing the height of the memory structure in the z-direction. As block size increases, this can lead to issues with block yield, block budget, the efficiency and speed of data allocation, and garbage collection. In some embodiments, a sub-block structure can be introduced to help address these issues by allowing erase and program at the sub-block level. FIG. 4C illustrates an example where the block is split into an upper sub-block SB1 and a lower sub-block SB1. Other embodiments can use larger numbers of sub-blocks. In FIG. 4C, lower sub-block SB0 includes word lines layers WLL0-WLL23 and upper sub-block includes word line layers WLL24-WLL47. In the embodiment of FIG. 4C, the sub-blocks are separated by a pair of dummy word lines DSB0 and DSB1. Other embodiments may have more or less dummy word lines between sub-blocks and may additionally or alternatively include a non-programmable sub-block junction transistor of a different size or structure than the memory cell transistors.

Figure 4D:
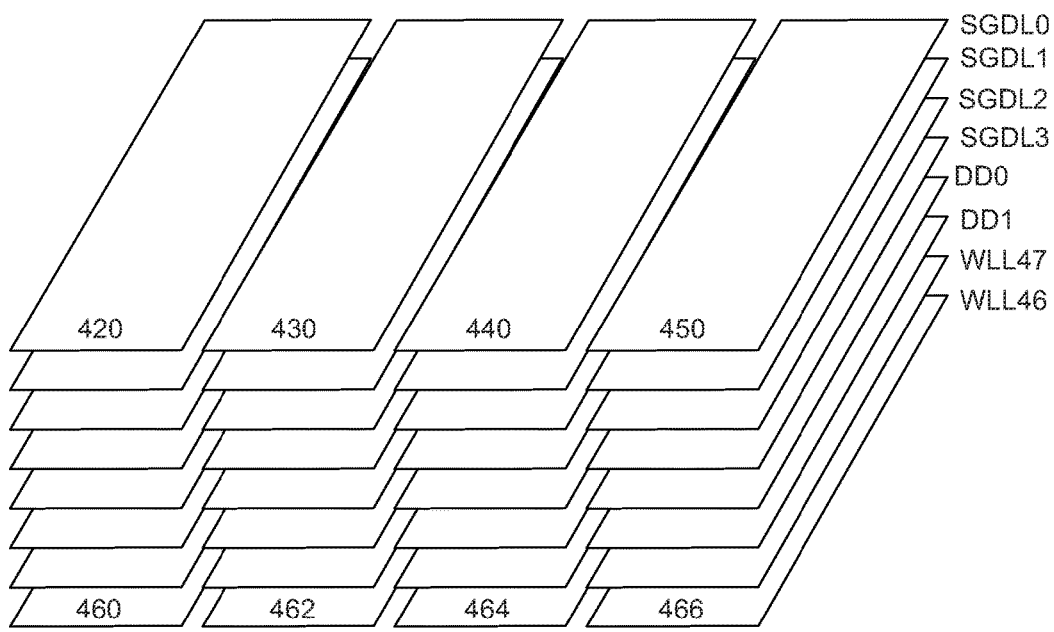
FIG. 4D depicts a view of the select gate layers and word line layers.
Figure 4D:
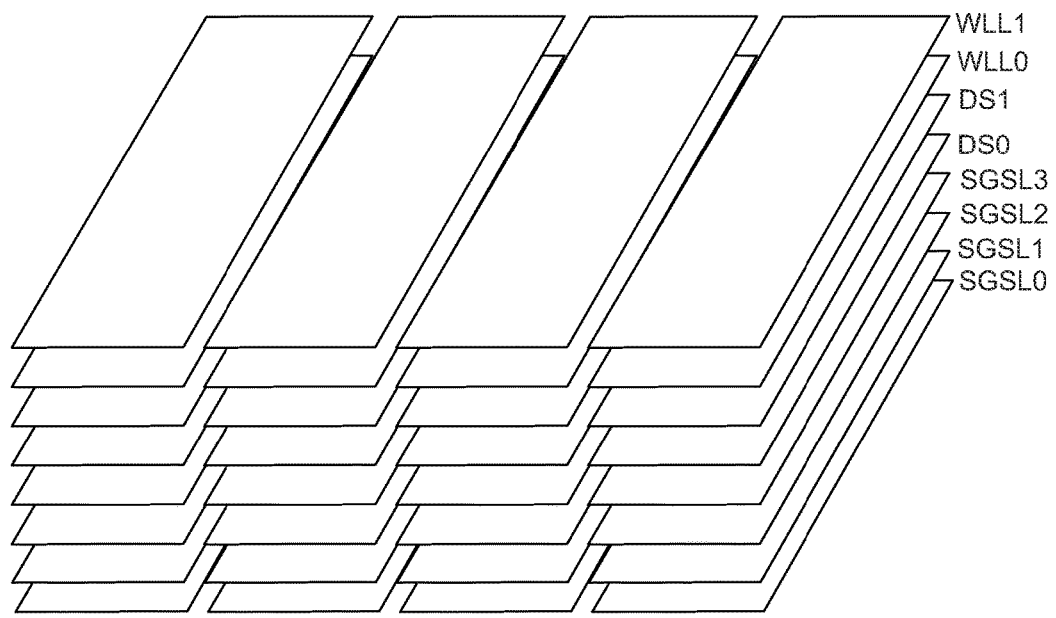

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment isolation areas 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line. The word lines can again be split into multiple sub-blocks.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
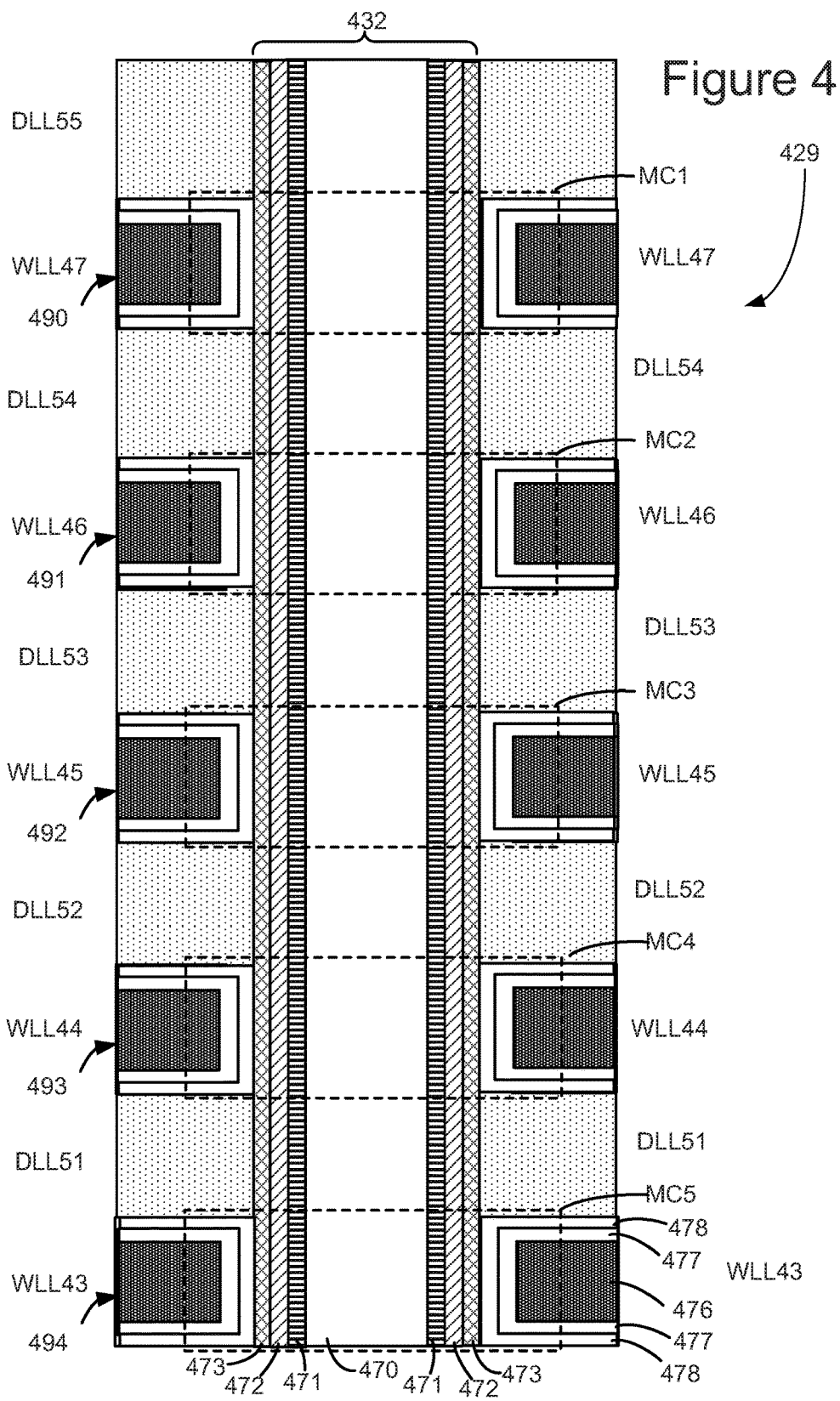
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL51, DLL52, DLL53, DLL54 and DLL55, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
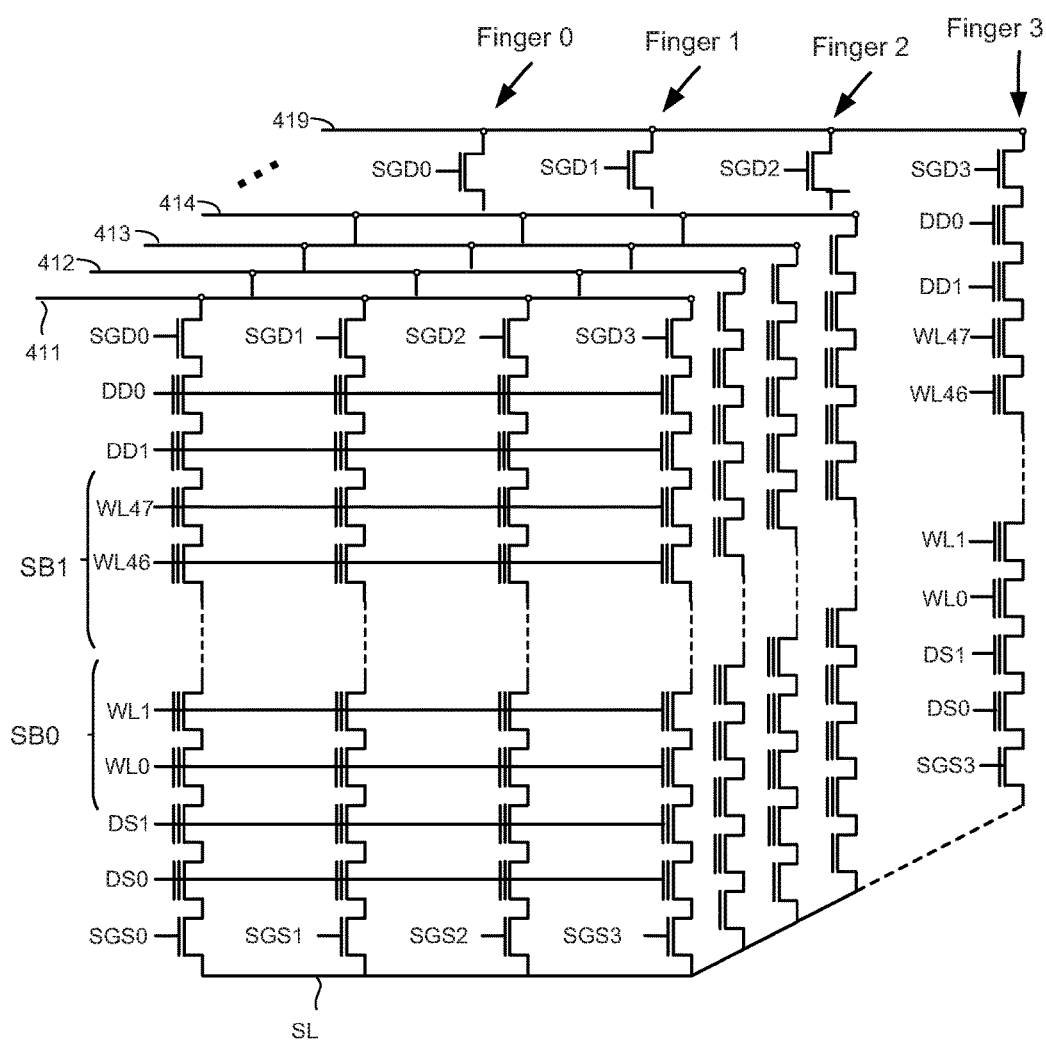
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four fingers finger 0, finger 1, finger 2 and finger 3. Finger 0 corresponds to those vertical NAND strings controlled by SGD0 and SGS0, finger 1 corresponds to those vertical NAND strings controlled by SGD1 and SGS1, finger 2 corresponds to those vertical NAND strings controlled by SGD2 and SGS2, and finger 3 corresponds to those vertical NAND strings controlled by SGD3 and SGS3. The example of FIG. 4F again shows the separation into upper sub-block SB1 and lower sub-block SB0, but the intermediate dummy word lines DSB0 and DSB0 in FIG. 4C are not explicitly represented.

Although the example memory system of FIGS. 4A-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

FIG. 6 is a table describing one example of an assignment of data values to data states. In the table of FIG. 6, S0=111. S1=110, S2=200, S3=000, S4=010, S5=011, S6=001 and S7=101. Other encodings of data can also be used. No particular data encoding is required by the technology disclosed herein.

In one embodiment, when a block is subjected to an erase operation, all memory cells are moved to data state S0, the erased state. As discussed further below, when the memory structure allows sub-block, erase selected sub-blocks of a physical block are erased while non-selected sub-blocks are not. In the embodiment of FIG. 6, all bits stored in a memory cell are 1 when the memory cells is erased (e.g., in data state S0).

Figure 7A:
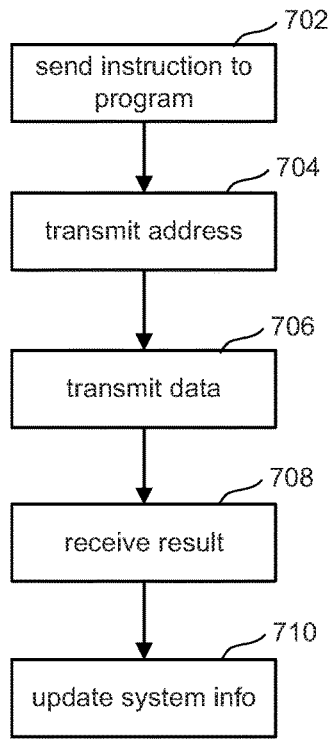
FIG. 7A is a flow chart describing one embodiment of a process for programming.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. controller can also scramble the data to achieve wear leveling with respect to the memory cells.

Figure 7B:
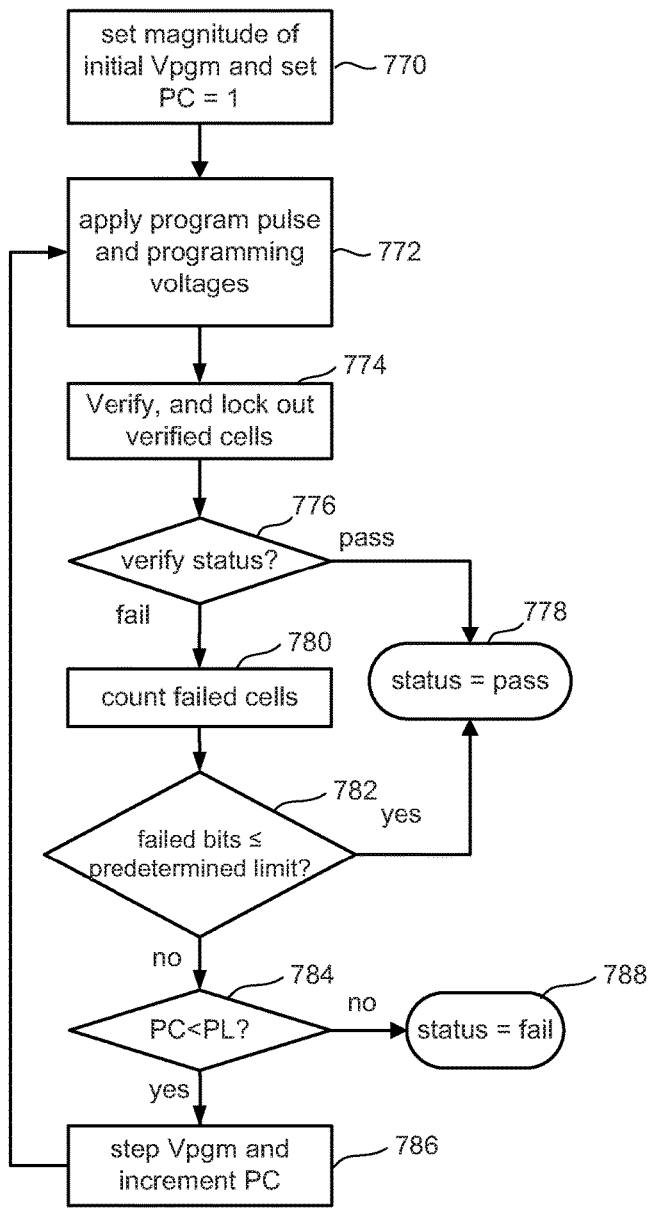
FIG. 7B is a flow chart describing one embodiment of a process for programming data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of FIG. 7B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner, all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units. For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Looking back at FIG. 4B, the memory structure is depicted with four rows of memory holes between isolation areas 402, 404, 406, 408 and 410. In some embodiments, when memory cells are further scaled down, one approach is to reduce the number of isolation areas which are used to separate fingers or increase the number of memory holes without increasing the number of isolation areas. The isolation areas are also used to let in etchant to etch away silicon nitride (SiN) layers inside the multiple oxide/nitride layer stack and replace them with tungsten layers which will be used as word line layers. That is when the memory stack is first fabricated, alternating layers of dielectric material (oxide) and silicon nitride are deposited or otherwise laid down. Then the memory holes are created through the alternating layers of oxide/nitride. Various materials that make up the memory holes are then added, as depicted in FIG. 4E. Then the isolation areas are carved into the stack. Subsequently, an etchant is inserted via the insolation areas in order to etch out the silicon nitride. Once the silicon nitride is removed, tungsten is used to replace the silicon nitride. This tungsten will become the word line layers.

If the number of isolation areas is reduced as compared to the number of memory holds, it means more memory holes will exist between every two neighboring isolation areas. This also means larger areas of silicon nitride need to be etched away and replaced by tungsten between every two neighboring isolation areas and, therefore, the silicon nitride etching process will take a longer time. Since the silicon nitride layers surrounding the outer memory holes (memory holes which are closer to the isolation areas) will be etched earlier by the etchant (typically hot phosphoric acid) coming in from vertically etched through isolation areas, while the silicon nitride layers surrounding the inner memory holes (memory holes which are closer to the isolation areas) will be etched later, the dielectric layers ($SiO_2$ layers) inside the outer memory holes will be exposed to the etchant for a longer time. Due to this exposure difference, the $SiO_2$ layers of the outer memory holes will be etched away more than that of the inner memory holes. This will cause thinner dielectric layer thickness inside the outer memory holes which leads to faster memory cell programming and erasing. It will also lead to comparatively thicker dielectric layer thickness for the inner memory holes which leads to slower memory programming and erase speeds.

When programming the memory cells as described above, prior to applying a program pulse at step 772 of FIG. 7B, if a memory cell should be programmed, then the corresponding bit line is grounded. On the other hand, if the memory cell should remain at its current threshold voltage, then the corresponding bit line is connected to a program inhibit level, such as Vdd. In many embodiments, the word lines of an erased block are programmed stating at the source end with word line word line WL0 of FIG. 4A-4F. As the other memory cells of the columns between the selected word line and the bit line are erased, this allows for the level on the bit line to be applied to the memory cells of the selected word line uniformly, whereas if any of the intermediate memory cells were programmed, this pre-charging of the memory cells could be blocked. The word lines of the block are then sequentially written in an order working from the source side on the bottom towards the bit lines at the drain end of the NAND strings. This is illustrated schematically in FIG. 8A.

Figure 8A:
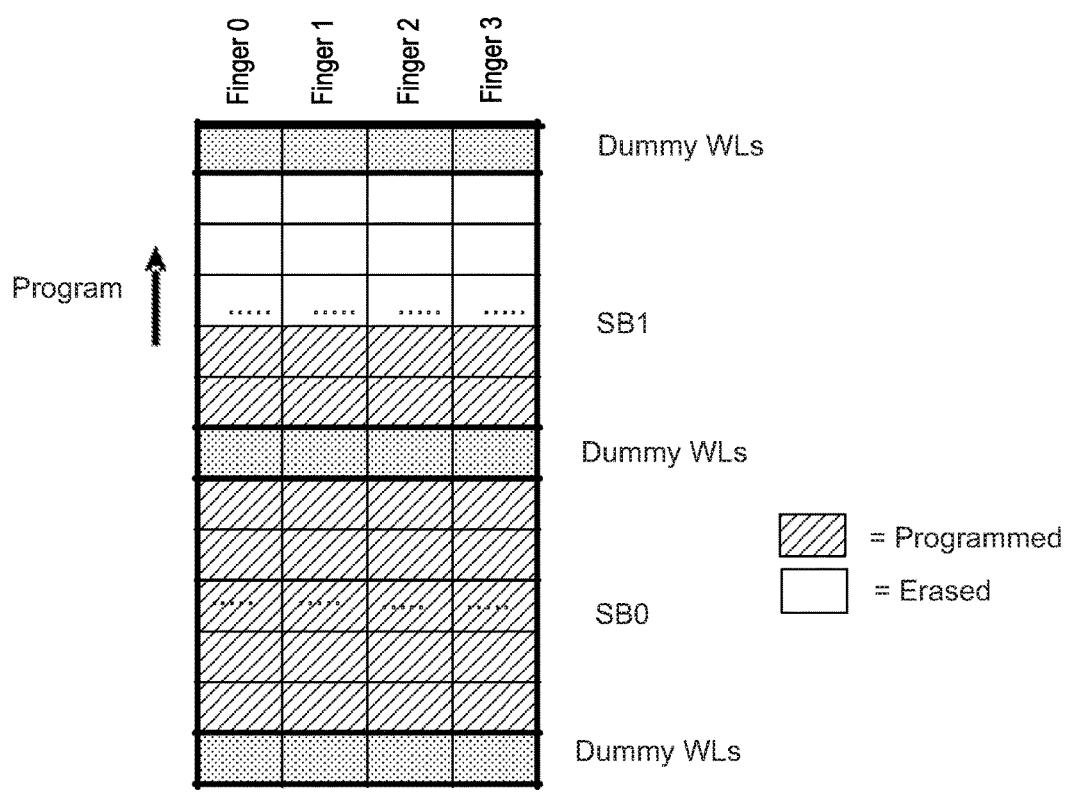
FIGS. 8A and 8B depict examples of word line programming orders for a two sub-block per physical block embodiment.

FIG. 8A is a simplified version of FIGS. 4A-4F describing one embodiment of a process for programming word lines of a block of memory cells sequentially from the source end (at bottom) towards the drain end. The block is shown at a stage where the lower sub-block SB0 is programmed and the first few word lines of the upper sub-block SB1 have been written. The stippled regions at top and represent the select gates and any dummy word lines at the ends of the strings through which the NAND strings are respectively connected to the bit and source lines on either end. The central stippled region represents any dummy word lines between sub-blocks SB1 and SB2, such as DSB0 and DSB1 of FIG. 4C, as well as any junction transistors between the sub-blocks, if these are included in the structure. In many embodiments, the dummy word lines at the source and drain ends, as well the inter-sub-block dummy word lines, if included, are not rewritten in a standard programming operation.

In embodiments where the memory system allows program and erase at the sub-block level, the state of one sub-block can affect the operation of the other sub-block. Whether or not the lower sub-block SB0 is programmed, the standard programming order illustrated in FIG. 8A can be used on upper sub-block S1 as the lower sub-block SB0 is not between the bit lines and the selected word line. Similarly, if the upper sub-block SB1 is erased, as after a full physical block erase, the standard programming order can be used for the lower sub-block SB0. However, in the case where the upper sub-block SB1 is programmed, but the lower sub-block SB0 has been erased and is to be programmed, the programming order can be altered in some embodiments.

Figure 8B:
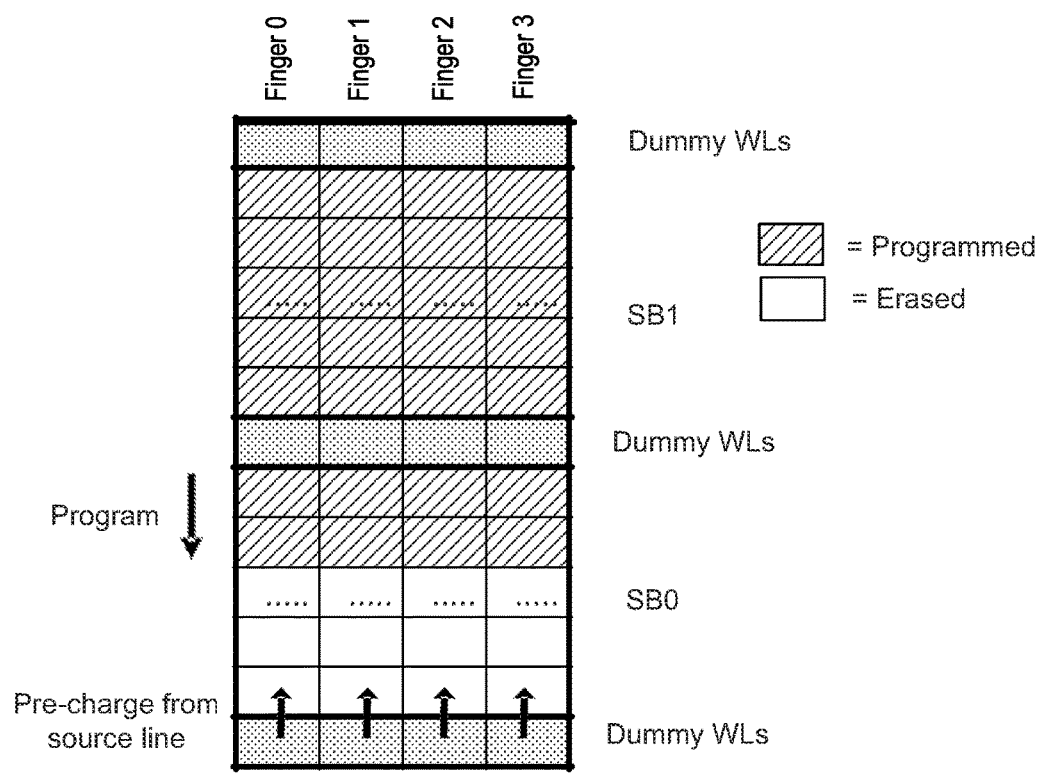

FIG. 8B illustrates the case where the upper sub-block SB1 is programmed and the lower sub-block is to be programmed. The conventional program order (programming up from the source side) for the lower sub-block SB0 creates problems when the upper sub-block SB1 is programmed as the pre-charge from the bit line side is blocked. The conventional order can also lead to serious program disturb concern for the data programmed in the upper sub-block SB1.

To help alleviate these problems, FIG. 8B illustrates an embodiment that uses a reverse, or "mirror" order of programming, where the word lines of the lower sub-block SB0 are programmed sequentially from the middle downwards. The columns can then be pre-charged form the source line, rather than the bit line, to either a program inhibit or program enable level, avoiding the problems that can arise when pre-charging from the top side when the upper sub-block SB1 is programmed.

Figure 9A:
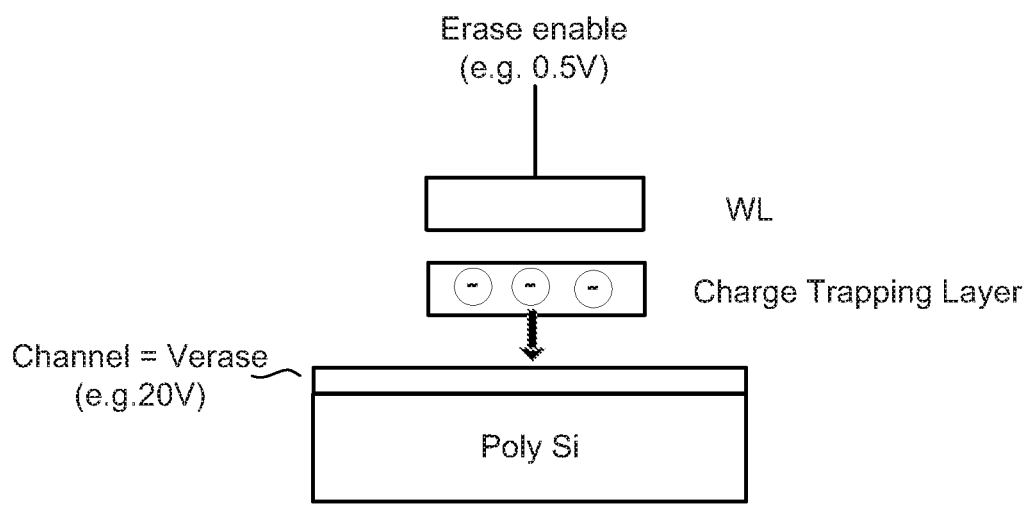
FIGS. 9A and 9B respectively illustrate an erase enabled and an erase inhibited memory cells in the structure of FIGS. 4A-4F.

In an erase process for a 3D NAND structure, such as illustrated in FIGS. 3 and 4A-4F, an erase operation is performed by applying an erase voltage to the channel region while setting the word lines to an erase enable level. For example, the erase enable level of ground or other low voltage value, such as 0.5V or more generally in the range of 0-1.0V, for example. FIG. 9A illustrates this for a single memory cell of the structure as in FIGS. 4C and 4E, but with the view rotated so that a column would now run left to right. With the word line setting the control gate to an erase enable voltage, the erase voltage is applied to the channel region from the P-Well (101 of FIG. 4C), through the source line SL to channel region (471 of FIG. 4F) around the column's inner core. By setting the channel region to an erase voltage of, for example, Verase=20-25V, an electrical field is formed across the charge trapping layer, pulling the charge off to the channel. This is similar the case of a 2D flash memory where the memory cells of a block are laid out in a horizontal array over a common well structure and the erase process pulls the charge off of the floating gates, except that in the 2D case the change is pulled directly down into the well structure by the erase voltage, whereas in the 3D case the charge is pulled in the channel region of the column, and then down the column to towards the well.

Figure 9B:
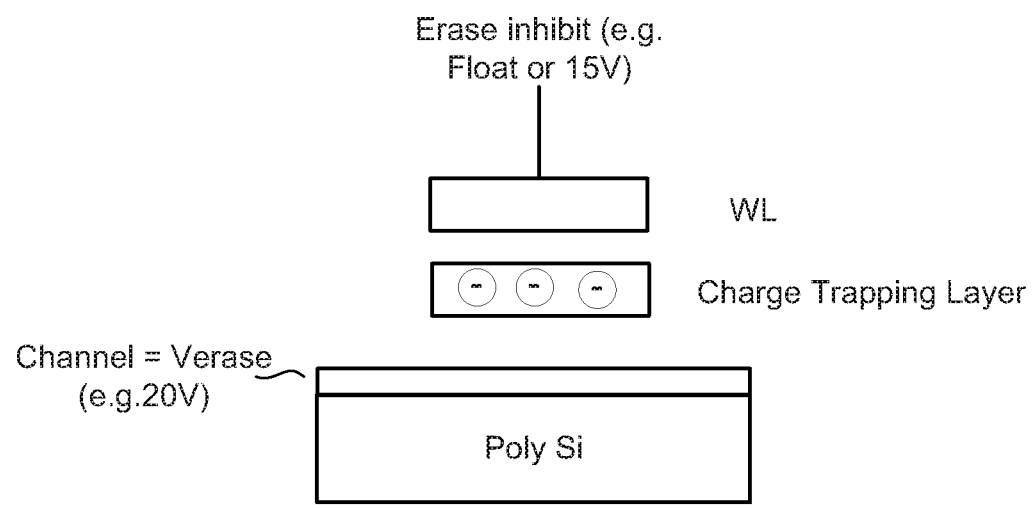

Although flash memory, including the 3D structure of FIGS. 3 and 4A-4F, is commonly erased at the block level, some embodiments also allow for a partial block erase. In particular, the sub-block structures described above with respect to FIGS. 4A-4F, 8A and 8B are configured to be programmed and erased at the sub-block level. As illustrated in FIG. 9A, to erase the memory cells along a word line, the word line is set to the erase enable level of ground or other low voltage so that when erase voltage is applied to channel, the desired voltage level is applied across the charge storage region. If, instead, a word line is at an erase inhibit level of a relatively high voltage (~15V, for example) as illustrated in FIG. 9B, the memory cell will not be subjected to the same strength of electric filed across its charge storage region. This can be done by either applying a direct bias to the word line or by capacitive coupling of the word line to the well structure if a word line is left to float, when the erase voltage is applied to the well structure, the word lines is pulled up through capacitive coupling to the block's well structure, so that a much lower voltage differential is applied across the charge storage regions of these cells. Consequently, even though a block is undergoing an erase operation, some word lines can be selected for erase and others non-selected. More detail on erase and erase inhibit is described in US patent publication 2016/0180939, which is hereby incorporated herein by this reference. In the following discussion, non-selected memory cells of a block will be erase inhibited by leaving their word lines to float, although other embodiments can use direct bias for non-selected word lines.

Although setting the word lines of a non-selected sub-block to float reduces the electric field across the charge storage region of erase non-selected memory cells, the non-selected memory cells are still part of the same physical block as the erase selected sub-block of the physical block. Consequently, the memory cells of a non-selected sub-block have a limited tolerance for erase inhibit and are likely to experience erase disturb. FIGS. 10A-10D consider different sub-block erase scenarios that can arise in a two sub-block embodiment such as described with respect to FIGS. 4A-4F, 8A and 8B.

Figure 10B:
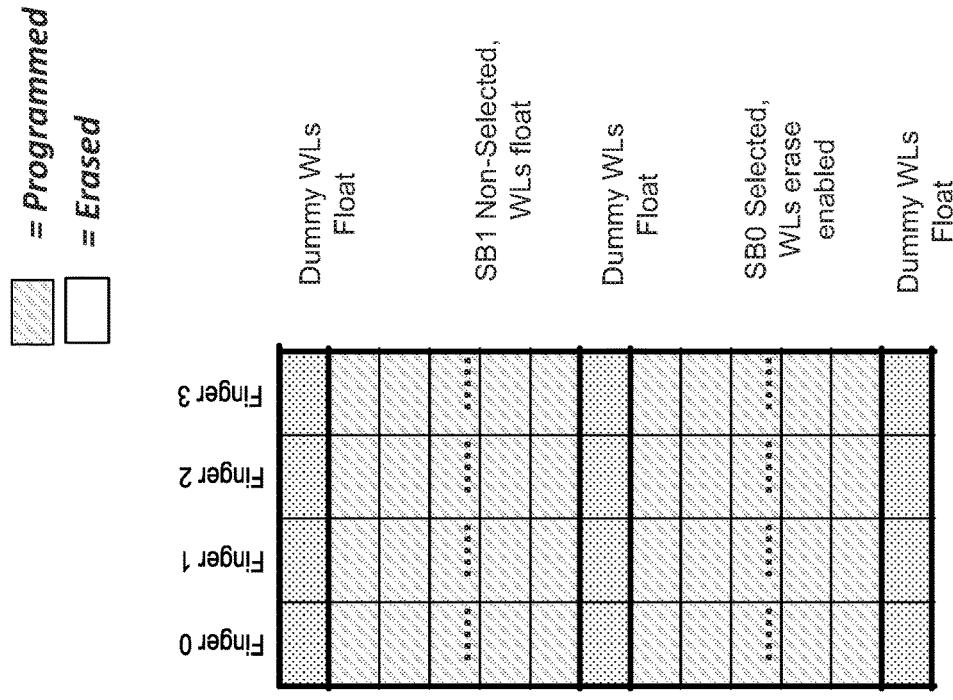
FIGS. 10A-10D consider different sub-block erase scenarios that can arise in a two sub-block embodiment such as described with respect to FIGS. 4A-4F, 8A and 8B.
Figure 10A:
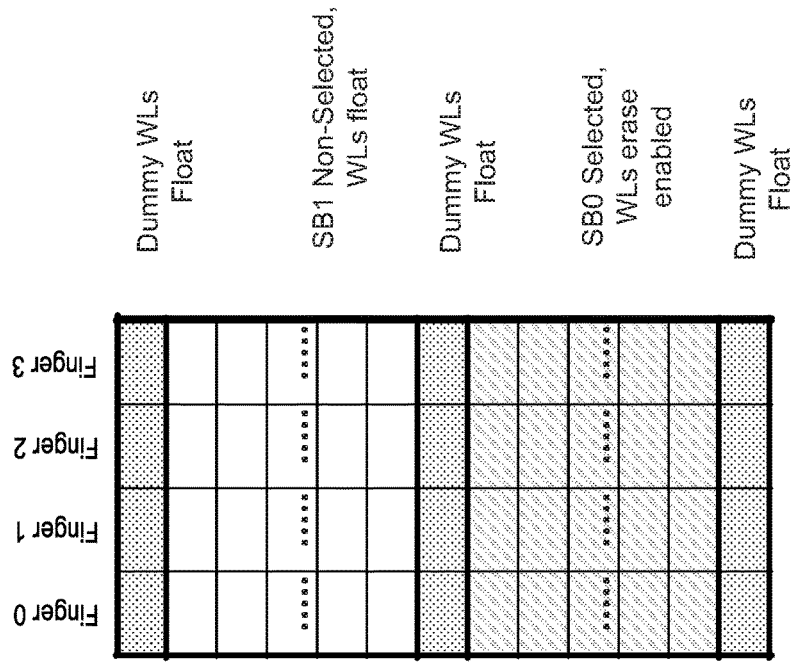

As in FIGS. 8A and 8B, each of FIGS. 10A-10D schematically represent the four fingers of the structure of FIGS. 4A-4F. The stippled regions at top and bottom represent the select gates and any dummy word lines at the ends of the strings and the central stippled region represents any central dummy word lines or sub-block junction transistors. FIGS. 10A and 10B consider a partial block erase of the lower sub-block and FIGS. 10C and 10D consider a partial block erase of the upper sub-block.

In the case of FIG. 10A, the upper sub-block SB1 is not currently written and is an erased state. The upper sub-block is non-selected for erase and the word lines are left to float, while the lower sub-block SB0 is selected to be erased and its word lines set to the erase enable level of ground or other low voltage level. In this case, as the un-selected upper sub-block is already erased, there is no issue with erase disturb.

In the case of FIG. 10B, the upper sub-block SB1 is again non-selected, but has been previously written with user data. The unselected upper sub-block's word lines are left to float (in a controlled manner), while the lower sub-block SB0 is selected to be erased and its word lines set to the erase enable level. In this case, when the erase voltage is applied, the elevated channel region under the memory cells of SB1 will now be a concern of erase disturb to the user data stored in the upper sub-block SB1 as there is a limited tolerance for erase inhibit.

Figure 10C:
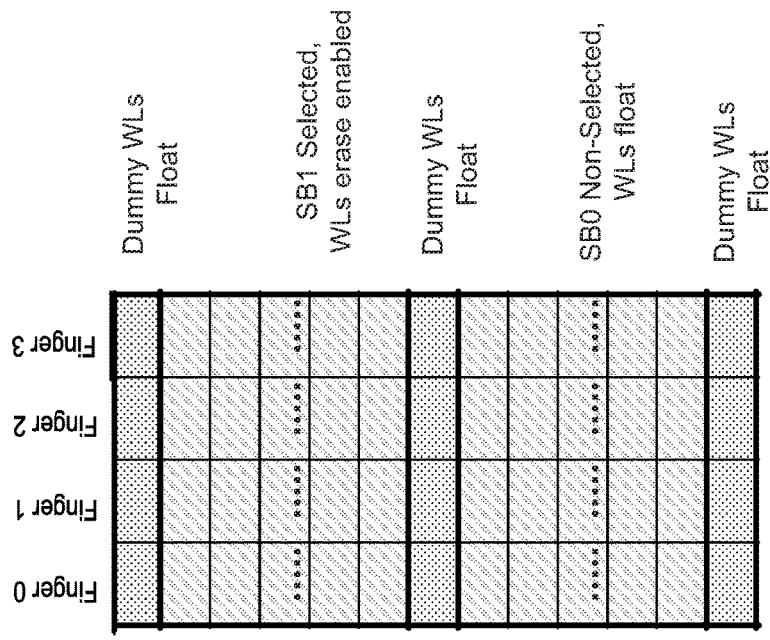
Figure 10D:
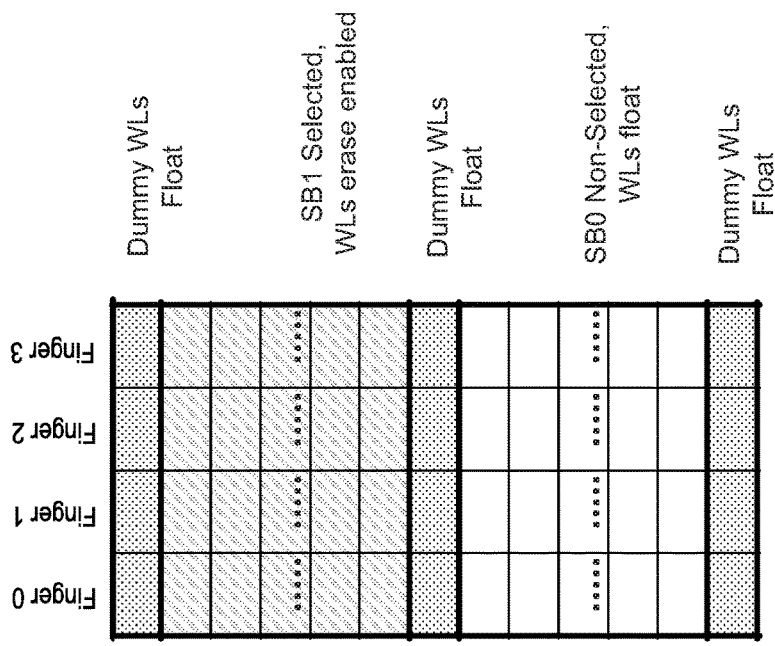

FIGS. 10C and 10D look at the when the upper sub-block is to be erased. In the case of FIG. 10C, the lower sub-block SB0 is non-selected for erase and left to float, but is in an erased state and contains no user data. The upper sub-block is erase selected and its word lines set to the low erase enable level. As the unselected sub-block is already in an erased state, there is no issue with erase disturb.

FIG. 10D illustrates the case when the lower sub-block is erase inhibited, but written with user data. For erase inhibit, the word lines for the lower sub-block SB0 are left to float. The word lines of the upper sub-block SB1 set to the low, erase enable level. When the erase voltage is applied to the channel, there will be the concern of erase disturb for the user data in the unselected lower sub-block.

Because of concern of erase disturb, once one of the sub-blocks is erased and programmed, the other sub-blocks are cycled for only some number M of cycles, after which a refresh of the previously programmed sub-block can be performed. The threshold value of M can vary with device design and can be set based on device characterization and, for example, be a settable parameter stored in a register. Target values for M could be in a range of, say, 30-300 writer/erase (W/E) cycles depending on the device, with M~100 as an exemplary value.

The sub-block structure described with respect to FIGS. 4A-4F, 8A, 8B and 10A-10D is introduced to help alleviate problems that may be introduced as the size of NAND physical blocks increases. By splitting the blocks in two or more pieces, each sub-block can be erased individually and programmed with separate page orders. As descried with respect to FIGS. 10A-10D, by configuring the block to allow top and bottom half-block erase, though, the non-erased sub-block is subject to erase disturb from the other, or "mirroring", half block of the physical block: If one half block experiences many write/erase cycles, the other block will be refreshed. The memory system can track the number of write/erase cycles that any of the sub-blocks is subjected to without the refreshing of the mirroring sub-blocks. In an exemplary set of embodiments, the system can track the erase counts of the sub-blocks. Although FIGS. 4A-4F, 8A, 8B and 10A-10D show two sub-blocks, other embodiments can use larger numbers of sub-blocks.

Considering a two sub-block embodiment for an erase disturb tracking method further, each sub-block is tracked by a set of flag bytes. In-between sub-block programming of one of the sub-blocks, the other sub-block (or "mirroring" sub-block) will not be programmed more than some threshold number M times, where, for this example M=100. Calling the lower sub-block SB0 and the upper sub-block SB1, the corresponding erase disturb counts are ED_SB0 and ED_SB1. As these counts correspond to the number of erases that the other, mirroring sub-block has undergone since the sub-block itself has been erased and rewritten, the erase of a sub-block resets its own counter, but leads to the other sub-block's counter being incremented.

Figure 11:
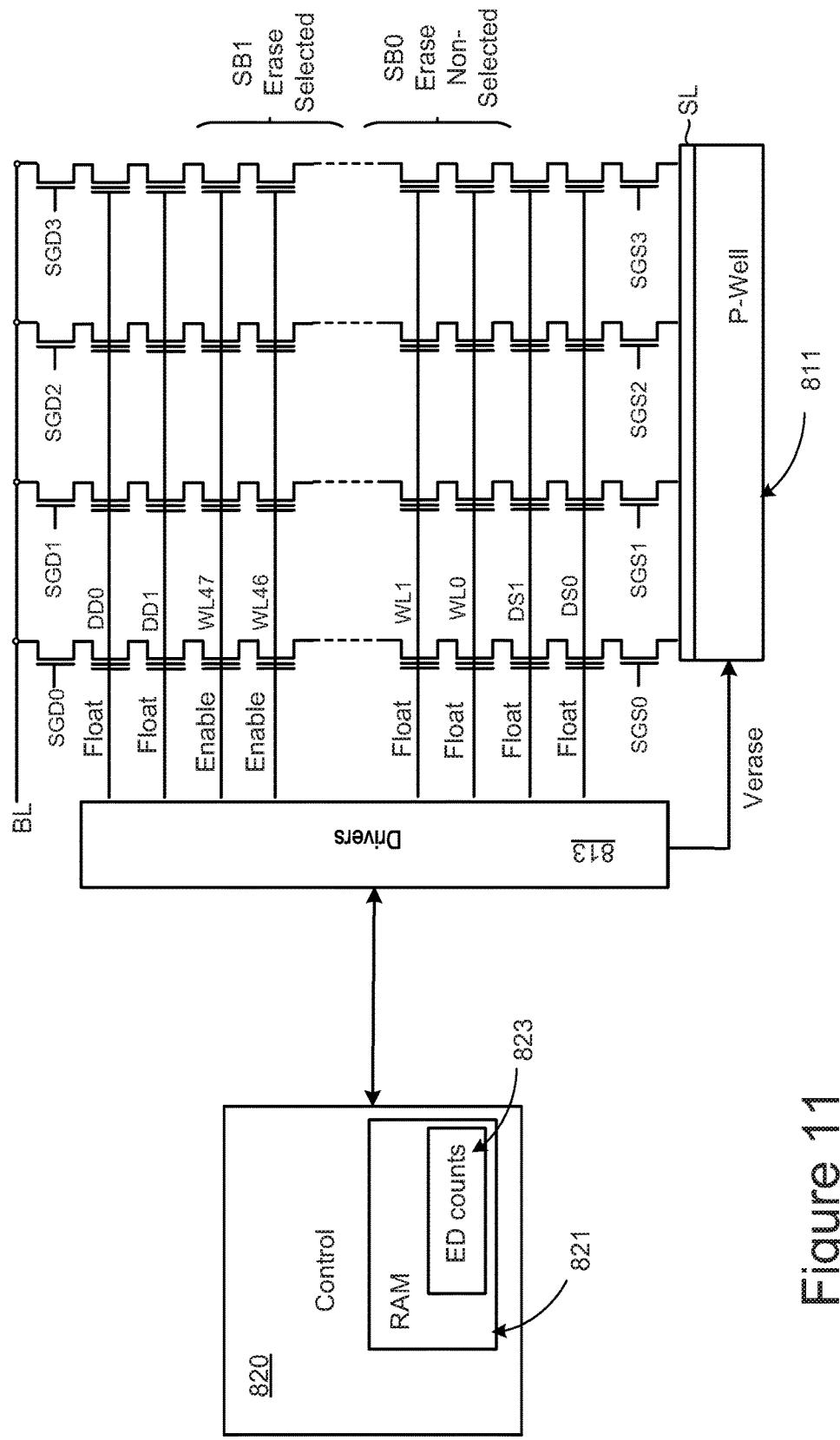
FIG. 11 represents elements relevant to the discussion of erase disturb management in a two sub-block per physical block arrangement.

FIG. 11 repeats in a simplified form a number of the elements of FIGS. 1-4F that are relevant to the discussion of erase disturb management in a two sub-block per physical block arrangement. The memory cells are represented by a set of 4 NAND strings, one for each of the fingers, each of which is connected between the bit line BL and source line SL, with the source line SL formed over the block's shared well region P-Well 811. FIG. 11 shows the memory cells biased for an erase operation by the Drivers 813. Relative to FIG. 1, the Drivers 813 are a simplified representation of the Read/write/erase circuits 128, Power Control 116, decoding elements, and other circuitry on the memory die 108 used to bias the array 126 for an erase operation. FIG. 11 shows an example where the upper sub-block SB1 is erase selected and the lower sub-block SB0 erase non-selected.

Drivers 813 can include the various switching and decoding circuitry, voltage supplies and regulator circuits, and charge pumps used to bias the array and apply the erase voltage. According to the embodiment, the erase selected memory cells are biased to a low voltage, such as ground or 0.5V or, more generally, in the 0-1V range, while the erase non-selected memory cells are set to an erase inhibit level, such as biasing their word lines directly to a high voltage of, say, around 15V, or by letting the non-selected word lines float in order to be pulled up capacitively by the erase voltage. Unless some or all of the dummy word lines are to be erased, these are also set to float, as illustrated in FIG. 11, or set to an erase inhibit level. Once the word lines are biased, the erase voltage can be applied to the block's P-Well 811.

The control circuit 820 can be one or more control circuits including the controller (122, FIG. 1), the on-chip control circuitry (110, FIG. 1), or some combination of these and be implemented through hardware, firmware, software, or some combination of these. According to the embodiment, the control means can maintain the erase disturb (ED) counts 823 in volatile memory RAM 821, non-volatile memory, or both, such as by maintaining the current counts in RAM, but periodically and/or at shutdown, storing the current values into non-volatile memory.

The data structure for the erase disturb counts for the sub-blocks can be maintained in block metadata, where it can be modified once per block programming operation. The sub-block count is accessed and updated once per sub-block erase or full block erase, in which would all of the block's sub-blocks would have their counter reset. Periodically and/or at shut down, the sub-block erase counts can be backed up in non-volatile memory. The RAM 823 or other memory requirement for maintaining the sub-blocks is about 1 byte per sub-block for a threshold value of around a hundred. For two sub-blocks per full physical block, this would 2 bytes per physical block and can be kept as part of the Flash Translation Layer (FTL) or Media Management Layer (MML 238, FIG. 2)). For a typical memory system, this would be a RAM size requirement of about 1 Mbyte.

Figure 12:
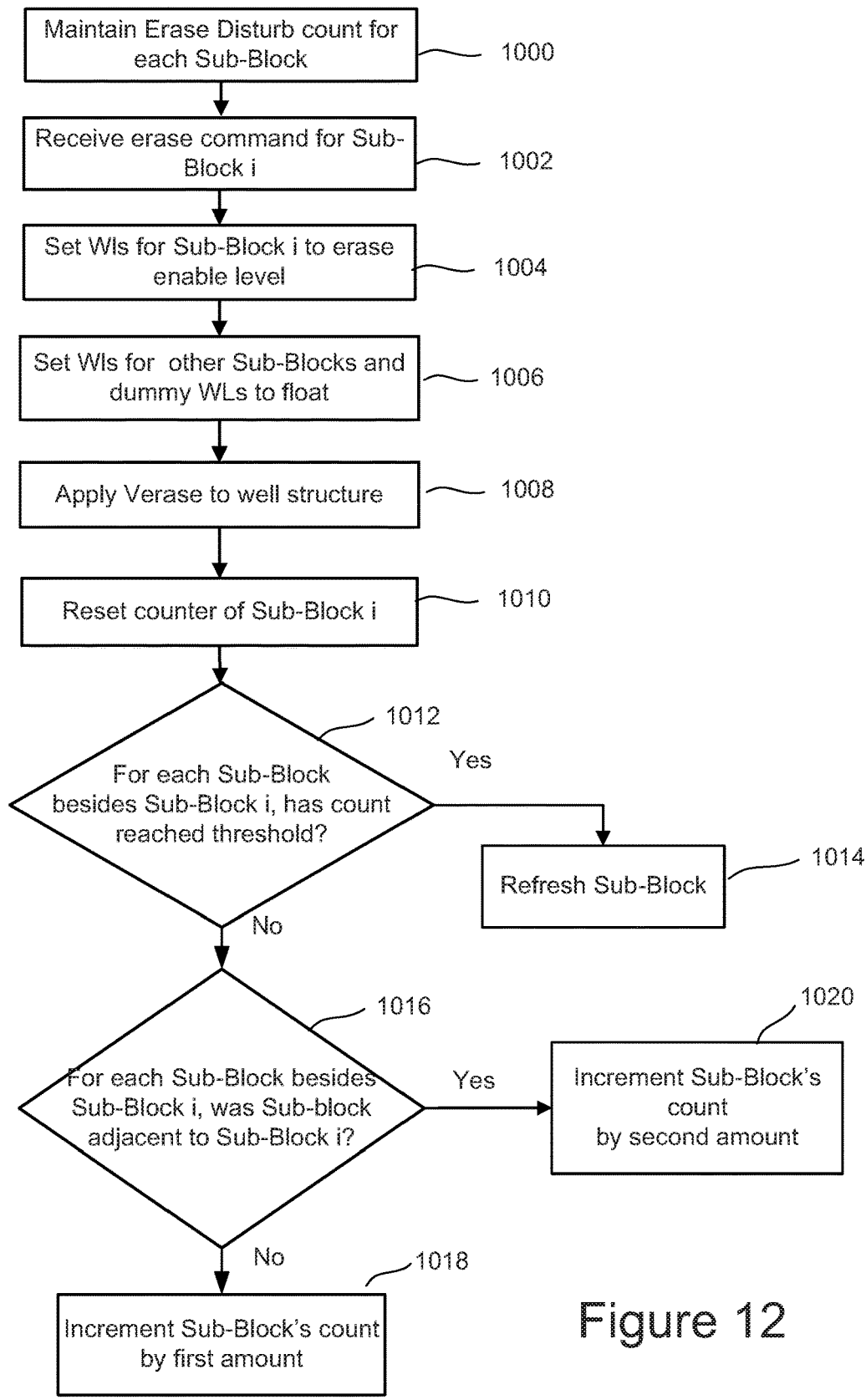
FIG. 12 is a flow chart describing one embodiment of a process for a memory system to maintain sub-block erase disturb counts and manage these counts.

For the embodiment of FIG. 11, the erase disturb counts would include an erase disturb count for each of SB0 and SB1, ED_SB0 and ED_SB1, respectively. When sub-block SB1 is erased, its counter ED_SB1 is reset to 0. The count ED_SB0 of the sub-block SB1, which tracks how many possibly disturb inducing erase operations have been performed on SB1 since SB0 was written is checked to determine whether it has reached a threshold value M: if not, ED_SB0 is incremented; and, if so, sub-block SB0 is scheduled for a refresh operation, garbage collection or other remedial action as can be executed on the sub-block SB0 by the control circuit or circuits 820 using the drivers 813. In the case where SB0 is erased and SB1 is not, the same process is followed, but with the roles of SB0 and SB1 and their counters interchanged. FIG. 12 is flow chart for this process, but in a more general context.

So far, the discussion of erase disturb management has been in the context of a 2 sub-block per physical block embodiment, where the each of the sub-blocks is a contiguous set of word lines. In other embodiments, particularly as the number of word lines increases, the physical block can be split into a larger number of sub-blocks, for example by splitting the physical block into quarter blocks. When the physical block is split into more than two blocks, erase disturb in one block can result from both adjacent and non-adjacent sub-blocks of a common physical block, although it may be the case that a sub-block having adjacent word lines leads to a greater amount of disturb than for non-adjacent sub-blocks. In some cases, the amount of disturb may also depend on the sub-block's location in the physical block, such as being nearer the source end. In still other embodiments, the sub-blocks need not be contiguous sets of word lines, but more generally sets of one more word lines that can also include interleaved word lines.

Considering the erase disturb tracking method in the context of more sub-blocks per physical block, such as a quarter block case, illustrates aspects of the more general case. Erase disturb will occur to each of the sub-blocks that hold static data if any the sub-blocks of the same physical block is erased, whether these sub-blocks are erased individually or in groups. When the cumulative number of erases on the other sub-blocks exceeds the writer/erase (W/E) threshold for a static sub-block, it can be refreshed. When a quarter block is erased, its erase disturb count is reset and the counts of the other sub-blocks are incremented by one. If any of the counts reach the limit, this triggers a refresh on the corresponding quarter block. In the case that physically neighboring quarter blocks have higher levels of disturb, these can be incremented by a higher scale.

FIG. 12 is a flow chart describing one embodiment of a process for a memory system to maintain sub-block erase disturb counts and manage these counts. In one embodiment, as represented in FIG. 11, the erase disturb counts ED counts 823 can be maintained in the RAM memory 821 of control circuit or circuits 820 to track and manage the sub-blocks with respect to erase disturb.

FIG. 12 begins at step 1000 by maintaining the erase disturb counts, each corresponding to a sub-block or, more generally, a set of one or more word lines of a physical block that may or may not be contiguous. These counts can be maintained in volatile memory, such RAM memory for the controller, non-volatile memory, or some combination of these. A command for a sub-block erase for a Sub-Block i is received at step 1004, after which the block is biased for the sub-block erase operation by biasing the word lines of Sub-Block i to an erase enable level at step 1004 and by biasing the word lines of the other sub-blocks and dummy word lines to float at step 1006. (Although step 1006 is shown after step 1004, the order can be reversed or, more commonly both steps 1004 and 1006 can be performed concurrently.) As discussed above with respect to FIG. 11, in one embodiment of the erase process the word lines of the selected sub-block (or sub-blocks) are set to the erase enable voltage (such as ground or 0.5V), while the word lines of the non-selected memory cells are left to float. Once the array is biased, the erase voltage (such as 20-25V) is applied to the block's well structure at step 1008. More generally, more than one sub-block can be erased concurrently, in which case Sub-Block i represents all of the erase selected sub-blocks.

At step 1010, the count ED_SBi for the erased block (or blocks) is reset. Although step 1010 is shown in the flow of FIG. 12 as being before the following incrementation steps, it can also be done after or concurrently with the incrementation steps.

At step 1012, each of the sub-blocks (other than Sub-Block i) of the same physical as Sub-Block i has its count checked against the threshold value. In some embodiments, as the stresses on different sub-blocks may differ, different threshold values can be used for separate sub-blocks or groups of sub-blocks. These threshold values can be determined as part of device characterization and be settable parameters. For example, these could be set at test time. Any of the sub-blocks that have reached the threshold value can be scheduled for refresh, garbage collection or other remedial action at step 1014. The refresh, garbage collection or other remedial action can either be implemented once the determination is made, or scheduled by the control circuitry for later implementation, such as in a background action. In the embodiment of FIG. 12, the comparisons of step 1012 are placed before the counts are incremented, but in other embodiments the incrementation can come first.

Steps 1016 and 1020 are optional steps that allow for the different sub-blocks to incremented by different amounts. Here, this differential incrementation is based on whether the set of word lines in a sub-block not being erased are adjacent to the sub-block Sub-Block i that was selected for erase at step 1002. As this results a word line left to float being adjacent to one held at the erase enable level, this may lead to a higher level of erase disturb. To account for this higher level of erase disturb, the adjacent sub-block can be incremented at a higher rate, say increased by 2 rather than 1, as step 1020. Other factors that can differentially affect the amount of disturb can similarly be incorporated.

If, at optional step 1016, it is determined that the sub-block is not adjacent to erase selected sub-block, (or otherwise not selected for a different incrementation), at step 1018 the count is incremented by the first, standard amount, here taken as an increase of one. If steps 1016 and 1020 are not included, all non-selected sub-blocks would receive the same count at 1018. In other alternative embodiments, rather than resetting the erase disturb counter to 0 and incrementing, the count could instead be reset to a threshold value and incremented down, or decremented, until reaching 0.

In one example, an apparatus includes a plurality of non-volatile memory cells formed over a shared well region. The memory cells include a first set of one more memory cells and a second set of one or more memory cells, the memory cells of the first set being distinct from the memory cells of the second set. One or more control circuits are connected to the memory cells and configured to program the memory cells and to independently erase each of the first and second sets of memory cells. The control circuits are further configured to determine whether a number of times that the second set of memory cells has been programmed and erased since the last time that the first set of memory cells has been programmed is greater than a threshold and, in response to the number exceeding the threshold, refreshing the first set of memory cells.

In some embodiments, a method includes maintaining a plurality of counts, each count corresponding to a sub-block of one or more memory cells of a NAND string having a plurality of sub-blocks, each of the sub-blocks including one or more memory cells and the memory cells of each sub-block being distinct from the memory cells of the other sub-blocks. Maintaining the plurality of sub-blocks includes, for each count, incrementing the count in response to a sub-block other than the corresponding sub-block being erased and resetting the count in response to the corresponding sub-block being erased. A first of the sub-blocks is refreshed in response to the corresponding count reaching a threshold value.

Other embodiments include an apparatus that comprises a plurality of NAND strings, each of a plurality of memory cells, forming a three dimensional structure that includes a block of memory cells divided into a plurality of sub-blocks, including a first sub-block and one or more second sub-blocks. A control means is configured to program the memory cells and configured to erase a selected one or more of the sub-blocks while not erasing one or more non-selected sub-blocks. The control means is further configured to determine for the first sub-block whether a number of times that the second sub-blocks have been erased since the first sub-block has been most recently programmed is greater than a threshold and, in response to the number exceeding the threshold, refreshing the first sub-block.

In examples implementations, the NAND strings can be a monolithic three dimensional memory structure as described above with respect to FIGS. 3 and 4A-4F, where a plurality of dielectric layers, a plurality of memory columns and plurality of isolation areas, the word line layers are arranged alternatingly with the plurality of dielectric layers forming a stack, the memory columns extend vertically through at least a portion of the stack. The NAND string of a block are formed over a common well structure, and the block is subdivided into a number of sub-blocks that can be configured to be independently programmed and erased.

The control means can include the controller (122, FIGS. 1 and 2), the on-chip control circuitry 110, or some combination of these and be implemented through hardware, firmware, software, or some combination of these. According to the embodiment, the control means can maintain the count in volatile memory, such as RAM, non-volatile memory, or both, such as by maintaining the current counts in RAM, but periodically and/or at shutdown, storing the current values into non-volatile memory. For any of these embodiments, the counts can be maintained on a memory die 108 and/or the controller 122, such as in the controller's RAM memory 122b as represented.

The control means can include erase circuitry that can include the various circuits on the memory die 108 (FIG. 1) used to bias the array 126 in an erase operation. These are represented in the read/write/erase circuits 128, decoding circuitry 124, power control 116 and can include the various switching and decoding circuitry, voltage supplies and regulator circuits, and charge pumps used to bias the array and apply the erase voltage. According to the embodiment, the erase selected memory cells are biased to a low voltage, such as ground or 0.5V or, more generally, in the 0-1V range, while the erase non-selected memory cells are set to an erase inhibit level, such as biasing their word lines directly to a high voltage of, say, around 15V, or by letting the non-selected word lines float in order to be pulled up capacitively by the erase voltage. The erase voltage can be applied to the channel region, such as to the substrate in a 2D embodiment or through the source line of the NAND strings in a 3D embodiment.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of non-volatile memory cells formed over a shared well region, the memory cells including a first set of one more memory cells and a second set of one or more memory cells, the memory cells of the first set being distinct from the memory cells of the second set, wherein the memory cells are arranged according to a NAND architecture, wherein the first set of memory cells is arranged between a bit line and the second set of memory cells, and the second set of memory cells is arranged between the first set of memory cells and a source line; and
one or more control circuits connected to the memory cells, the control circuits configured to:
program the memory cells, wherein when programming the memory cells, the control circuits:
program the first set of memory cells, but not the second set of memory cells, sequentially from memory cells of the first set nearest to the second set towards the memory cells nearest the bit line; and
program the second set of memory cells, but not the first set of memory cells, sequentially from memory cells of the second set nearest to the first set towards the memory cells nearest the source line;
independently erase each of the first and second sets of memory cells; and
determine whether a number of times that the second set of memory cells has been programmed and erased since the last time that the first set of memory cells has been programmed is greater than a threshold and, in response to the number exceeding the threshold, refreshing the first set of memory cells.

2. The apparatus of claim 1, wherein the second set of memory cells includes a plurality of distinct subsets, wherein the controller is configured to independently erase each of the subsets, and wherein the number of times that the second set of memory cells has been programmed and erased includes the number of times that an erase has been performed on one or more the subsets.

3. The apparatus of claim 2, wherein the plurality of memory cells is arranged as one or more NAND strings and wherein one or more of the subsets do not include a memory cell adjacent to the memory cells of the first set along the NAND string.

4. The apparatus of claim 1, wherein refreshing the first set of memory cells includes a garbage collection operation.

5. The apparatus of claim 1, wherein the control circuits include one or more driver circuits connected to the memory cells and configured to erase a selected one of the first and second sets of memory cells while not erasing a non-selected one of the first and second sets of memory cells in a sub-block erase operation in which the driver circuits set control gates of the memory cells of the selected set to an erase enable voltage level, sets control gates of the memory cells of the non-selected set to float, and applies an erase voltage to the shared well region.

6. The apparatus of claim 5, the plurality of memory cells further including one or more dummy memory cells, wherein in the sub-block erase operation, the driver circuits set control gates of the dummy memory cells to float.

7. The apparatus of claim 1, wherein the control circuits are configured to maintain a count for the first set of memory cells, incrementing the count in response to the second set of memory cells being erased and resetting the count in response to the first set of memory cells being erased; and refreshing the first of the sets of memory cells in response to the count reaching a threshold value.

8. The apparatus of claim 1, wherein the plurality of memory cells are part of a single block of memory cells of which the first and second sets memory cells are sub-blocks.

9. The apparatus of claim 1, wherein the control circuits include a volatile memory and tracks the number of times that the second set of memory cells has been programmed and erased since the last time that the first set of memory cells has been programmed by incrementing a count maintained in the volatile memory.

10. The apparatus of claim 9, wherein the second set of memory cells includes a plurality of distinct subsets, wherein the controller is configured to independently erase each of the subsets, and wherein the count includes the number of times that an erase has been performed on one or more the subsets.

11. The apparatus of claim 10, wherein an amount by which the count is incremented is dependent upon whether a memory cell of the first is adjacent to a memory of a subset being erased.

12. The apparatus of claim 1, wherein the memory cells are part of a monolithic three-dimensional semiconductor memory device where the memory cells are arranged in multiple physical levels above a substrate and comprise a charge storage medium.

13. The apparatus of claim 1, wherein, when programming the first set of memory cells, the control circuits are configured to pre-charge NAND strings to which the second set of memory cells belong from the source line to one of either a program inhibit voltage level or a program enable voltage level.

14. An apparatus, comprising:
a plurality of NAND strings, each of a plurality of memory cells, forming a three dimensional structure that includes a block of memory cells divided into a plurality of sub-blocks, including a first sub-block and one or more second sub-blocks; and
control means configured to program the memory cells and configured to erase a selected one or more of the second sub-blocks while not erasing the first sub-block, the control means further configured to determine for the first sub-block whether a number of times that the second sub-blocks have been erased since the first sub-block has been most recently programmed is greater than a threshold and, in response to the number exceeding the threshold, refreshing the first sub-block, wherein the first sub-block is arranged between a bit line and the second sub-block, and a first of the second sub-blocks is arranged between the first sub-block and a source line, wherein the control means is configured to program the first sub-block, but not the second subblocks, sequentially from memory cells of the first sub-block nearest to the first of the second sub-block towards the memory cells nearest the bit line, and wherein the control means is configured, prior to erasing the second sub-block, to program the first of the second sub-blocks, but not the first subblock, sequentially from memory cells of the first of the second sub-blocks nearest to the first sub-block towards the memory cells nearest the source line.

15. The apparatus of claim 14, wherein the control means is configured to determine for the first sub-block whether a number of times that the second sub-blocks have been erased since the first sub-block has been most recently programmed is greater than a threshold by maintaining for the first sub-block a count, incrementing the count in response to one of the second sub-blocks being erased and resetting the count in response to the first block being erased, and, in response to the count exceeding the threshold, refreshing the first sub-block.

16. The apparatus of claim 15, wherein an amount by which the count is incremented is dependent upon whether the second sub-block being erased it adjacent to the first sub-block.

17. The apparatus of claim 15, wherein the count is maintained in a volatile memory.

18. The apparatus of claim 14, wherein the memory cells of the first sub-block are not adjacent to memory cells of one or more of the second sub-blocks.

* * * * *